(12) United States Patent
Hsu

(10) Patent No.: US 7,577,056 B2
(45) Date of Patent: Aug. 18, 2009

(54) SYSTEM AND METHOD FOR USING A DLL FOR SIGNAL TIMING CONTROL IN A EDRAM

(75) Inventor: Kuoyuan Hsu, San Jose, CA (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 200 days.

(21) Appl. No.: 11/735,455

(22) Filed: Apr. 14, 2007

(65) Prior Publication Data

US 2008/0252352 A1 Oct. 16, 2008

(51) Int. Cl.
*G11C 8/00* (2006.01)
(52) U.S. Cl. .................. 365/233; 365/194; 365/191
(58) Field of Classification Search .................. 365/233, 365/194, 191, 189.03, 189.05, 150, 222, 365/230.06, 230.08
See application file for complete search history.

(56) References Cited

U.S. PATENT DOCUMENTS

| 2002/0097626 | A1* | 7/2002 | Hidaka ...................... 365/222 |
| 2002/0141280 | A1* | 10/2002 | Hamamoto et al. .......... 365/233 |
| 2002/0181297 | A1* | 12/2002 | Jones et al. ................. 365/194 |
| 2003/0011414 | A1* | 1/2003 | Bell ............................ 327/233 |
| 2007/0133338 | A1* | 6/2007 | Hoffmann ................... 365/233 |

* cited by examiner

*Primary Examiner*—Dang T Nguyen
(74) *Attorney, Agent, or Firm*—K & L Gates LLP

(57) ABSTRACT

The present invention discloses an embedded dynamic random access memory (eDRAM) comprising a clock signal, at least one delay-locked loop (DLL) circuit coupled to the clock signal and configured to generate a plurality of control signals each having a predetermined delay from the clock signal, and at least one DRAM array coupled to the plurality of control signals, wherein the DRAM array operates in a plurality of steps controlled by the plurality of control signals.

17 Claims, 3 Drawing Sheets

SYSTEM AND METHOD FOR USING A DLL FOR SIGNAL TIMING CONTROL IN A EDRAM

BACKGROUND

The present invention relates generally to dynamic random access memory (DRAM) design, and more particularly to signal timing control in embedded DRAM (eDRAM).

Integrated circuit design of a microelectronic chip is generally aimed at reducing the size of components and connections/spacings between components, as well as increasing processing speed while maintaining the integrity of data signals. Typically, a high performance microprocessor chip uses a high-speed cache memory, for storing, for example, instructions and data needed by a processor within the chip. The high-speed cache memory, referred to as the first level (L1) cache, is located proximate to the processor for maximizing efficiency and accuracy. The L1 cache memory is primarily made from static random access memory (SRAM) technology, such as a 6-transistor SRAM, which provides reliable performance. However, the SRAM takes up a very large area of the microprocessor chip.

Due to the size restriction of the L1 cache, upon the occurrence of a data miss, the processor issues commands to get data from an off-chip main memory. A high data miss rate results in a significant performance penalty. To overcome the problem associated with data misses, a second level of cache memory (L2) is provided on the microprocessor chip for storing, for example, instructions and data needed by the processor.

Embedded DRAMs (eDRAMs) with wide data bandwidth and wide internal bus width have been proposed for the L2 cache to replace conventional SRAM cache. Since each DRAM memory cell is formed by one transistor and a capacitor, the physical size of DRAM cache is significantly smaller than that of six-transistor SRAM for the same density. But serving as a L2 cache memory, the eDRAM has to operate at a greater speed, with a cycle time at 6 ns or less. This demands not only shorter cell access time but also tighter internal timing control of the eDRAM. FIG. 1 is a waveform showing timing relationships of some critical signals in a clock cycle Tc. Curve 110 is a word-line (WL) signal, which turns on a WL at time T1. Once the WL is turned on, a bit-line (BL) pair 120 starts to split. At time T2, when the BL pair 120 develops enough voltage differentiation, a sense-amplifier enable signal is activated to start sensing the BL voltage differentiation. After cell data being sensed, a column select signal is enabled at time T3 to allow data output. Then the WL is turned off at time T4. In order to prepare for a next cycle read, the BL starts to pre-charge at time T5 before the clock cycle Tc ends. In order for the eDRAM to function properly, the timings of T1, T2, T3, T4 and T5 are all tightly controlled. Especially, relationships of these timings must have sufficient margins at all specified process, voltage and temperature (PVT) conditions.

Traditional eDRAMs often use self timed delay chain to control the timings of the critical signals. But such delay chain may have different reactions to PVT variations than the core array, i.e., a timing relationship generated by the delay chain may not match what is required by the eDRAM cell array. In order to ensure that the eDRAM functions properly in all specified PVT conditions, circuit designers must design in greater timing margins, therefore the eDRAM operation speed will be slow down.

Using array device, e.g., building mini-arrays outside of the real array area, for timing tracking may solve the above mismatching problems, as the mini-arrays and the real arrays have the same structure, and may respond identically to PVT variations. But in most cases, adding mini-arrays in an already large chip is not practical.

As such, what is desired is timing control circuit that can precisely control delay time and automatically adapt to the clock signal variations for various internal control signals in an eDRAM.

SUMMARY

In view of the foregoing, the present invention discloses an embedded dynamic random access memory (eDRAM) comprising a clock signal, at least one delay-locked loop (DLL) circuit coupled to the clock signal and configured to generate a plurality of control signals each having a predetermined delay from the clock signal, and at least one DRAM array coupled to the plurality of control signals, wherein the DRAM array operates in a plurality of steps controlled by the plurality of control signals.

The construction and method of operation of the invention, however, together with additional objects and advantages thereof will be best understood from the following description of specific embodiments when read in connection with the accompanying drawings.

DESCRIPTION

The following will provide a detailed description of an eDRAM using a delay-locked loop (DLL) circuit to precisely control its internal signal timings. A DLL is a closed-loop feedback control system that generates and outputs a signal in relation to the frequency and phase of an input ("reference") signal. The DLL compares the phase of one of its outputs to the input clock to generate an error signal which is then integrated and fed back as the control to all of the delay elements. The main component of the DLL is a delay chain composed of many delay gates connected back-to-back. The input of the chain (and thus of the DLL) is connected to the clock that is to be negatively delayed. A multiplexer is connected to each stage of the delay chain. A selector of this multiplexer is automatically updated by a control circuit to produce the negative delay effect. The output of the DLL is the resulting, negatively delayed clock signal. The phase shift can be specified either in constant terms (in delay chain gate units), or as a proportion of the clock period, or both. In such a way, the output of the DLL can be precisely controlled. When the output delay is proportional to the input clock signal, that proportion is always kept in various process, voltage and temperature conditions.

Figure 1:
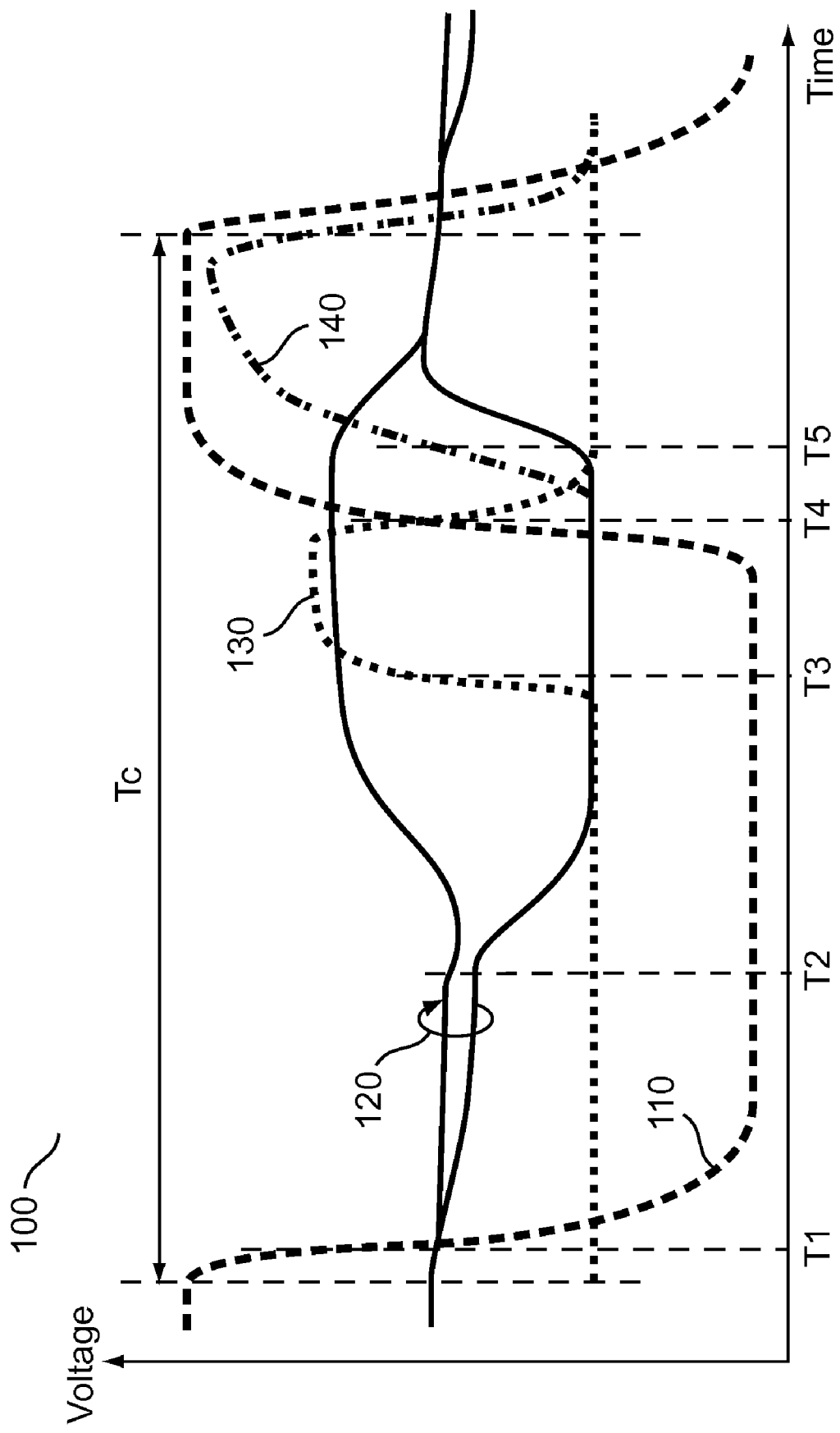
FIG. 1 is a waveform illustrating timings of various internal signals of an eDRAM.
Figure 2:
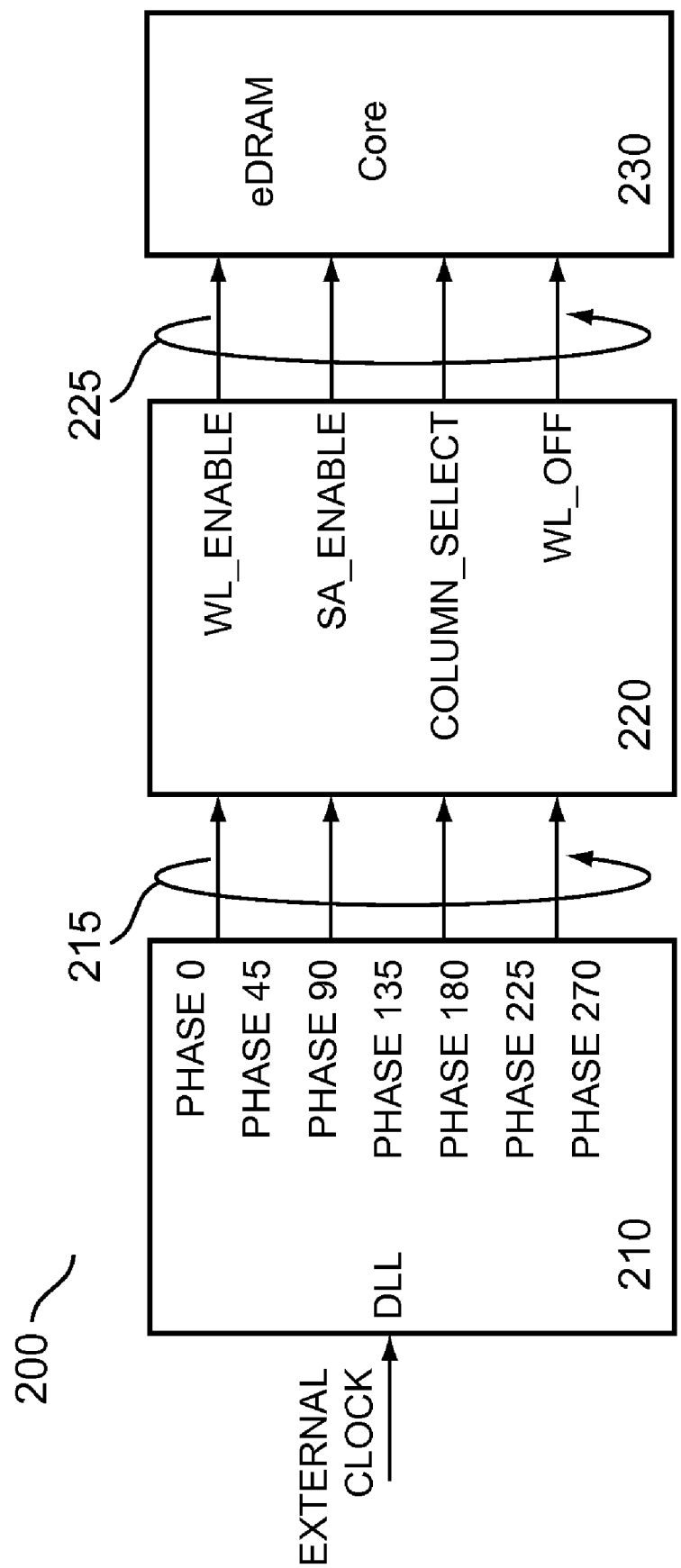
FIG. 2 is a block diagram illustrating an eDRAM using a delay-locked loop (DLL) circuit to generate the internal signals according to an embodiment of the present invention.

FIG. 2 is a block diagram illustrating an eDRAM 200 using a delay-locked loop (DLL) circuit 210 to generate the internal signals according to an embodiment of the present invention. The DLL circuit 210 has an external clock input. Inside the DLL circuit 210 there may be multiple modules for generating multiple clock outputs 215 with predetermined delays. A timing control circuit 220 takes in the clock outputs 215, and generates various internal control signals 225, such as WL_ENABLE, SA_ENABLE, COLUMN_SELECT and WL$_{13}$ OFF, with different delays for multi-step operation of an eDRAM core 230. There is a plurality of DRAM arrays in the eDRAM core 230. In order to achieve high access speed, the size of the DRAM array in the eDRAM core 230 may be smaller than that in a stand-alone DRAM. The internal control signals 225 is then supplied to an eDRAM core 230 for proper read/write operations thereof. Referring to FIG. 1, the WL_ENABLE signal is for turning on a selected WL at time T1. The SA_ENABLE signal is for activating a set of selected sense amplifiers at time T2. The COLUMN_SELECT signal is for turning on a selected column for outputting the data at time T3. Then the WL_OFF signal is for turning off the selected WL at T4.

Referring to FIG. 2, each of the delays of these control signals 225 is proportional to the external clock signal as a result of being generated by the DLL circuit 210, i.e., the timing partition of the time T1, T2, T3 or T4 can be exact ½, ¼ or ⅛, etc., of the clock cycle time. Such timing partition is well suited for the eDRAM's multi-step operations. The frequency variation of the external clock can proportionally change the timings of the multiple steps, such as WL turn-on, sense-amplifier enabling, etc. Therefore, margins of these steps can always be averaged out to an optimal level, which allows the eDRAM 200 to yield the best speed distribution and operate more robustly than the traditional eDRAMs, which employ the self timed timing control. Since each delay is fixed in the self timed time control, when external clock frequency is relaxed, it only gives extra time to the later pre-charging phase, which does not boost the overall operation robustness. On the other hand, if the external clock frequency is tighten in high speed eDRAM designs, the later pre-charging phase may be un-proportionally squeezed, which may cause operation failures in the eDRAM.

Although only four signals are illustrated, one have skills in the art would appreciate that more signals, such as input/output sense amplifier enable signal, may also be involved in the eDRAM operations and their delays can also be generated by DLL circuits.

Figure 3:
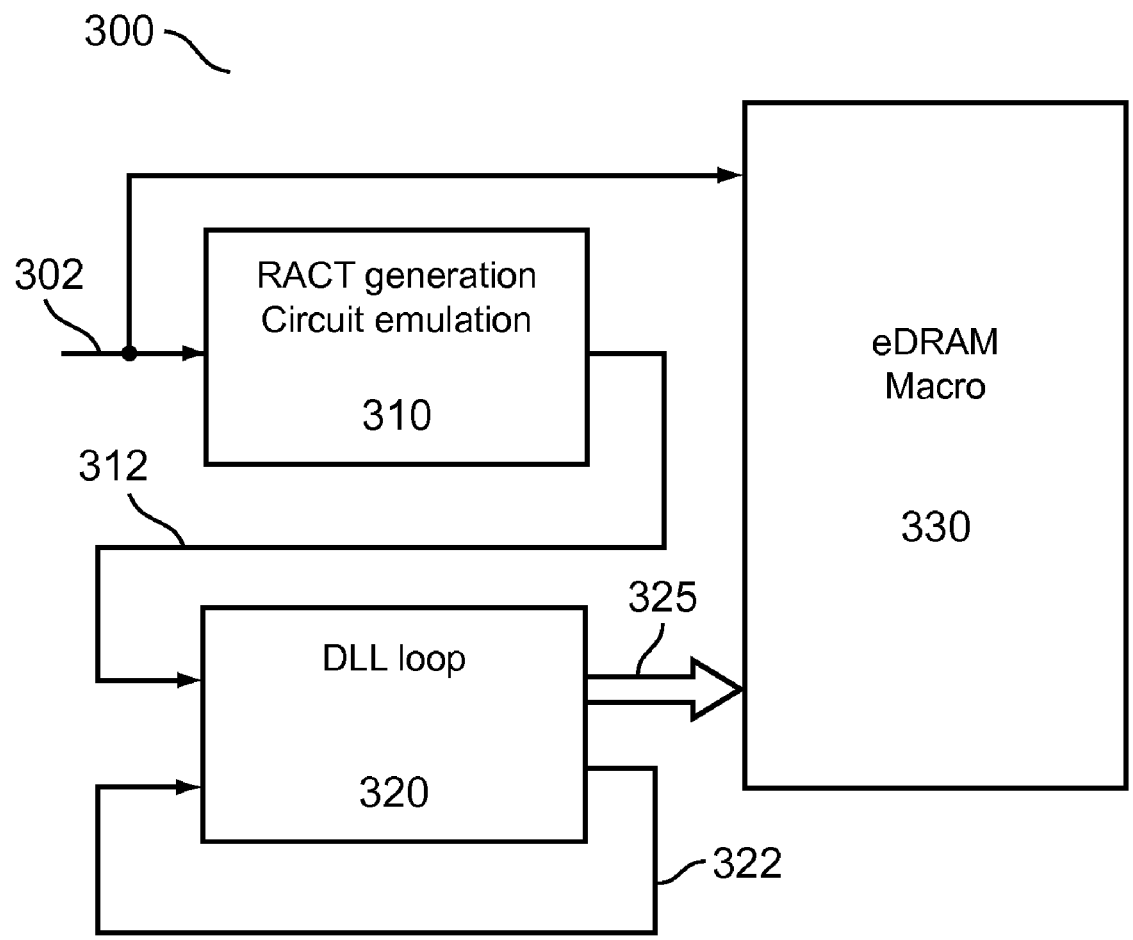
FIG. 3 is a block diagram illustrating a DLL circuit being integrated in chip with both processors and eDRAM.

FIG. 3 is a block diagram illustrating a DLL circuit 320 being integrated in an eDRAM chip 300. A system clock 302 is supplied to a RACT generation circuit emulator 310 which generates a clock signal 312 only when an eDRAM macro 330 needs to be activated. RACT stands for row active. The DLL circuit 320 takes in the clock signal 312 and generates a plurality of control signals 325 for controlling the eDRAM macro 330. Timings of the plurality of control signals 325 are partitioned as described in above paragraphs. The eDRAM macro 330 may contain multiple eDRAM modules as long as they share the same control timings. A feedback signal 322 is used by the DLL circuit 320 for generating the control signals 325 that tracks the clock signal 312. Although details of the DLL circuit 320 is not described in the present disclosure, DLL operation is well-known in the semiconductor industry, one having skills in the art would have no difficulty to construct one for use by the eDRAM chip 300.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. An embedded dynamic random access memory (eDRAM) comprising:
   a clock signal;
   at least one delay-locked loop (DLL) circuit coupled to the clock signal and configured to generate a plurality of control signals each having a predetermined delay from the clock signal;
   a receive activate circuit coupled between the clock signal and the DLL circuit for controlling activations of the DLL circuit when needed by a system; and
   at least one DRAM array coupled to the plurality of control signals,
   wherein the DRAM array operates in a plurality of steps controlled by the plurality of control signals.

2. The eDRAM of claim 1, wherein the DLL circuit comprises a feedback loop.

3. The eDRAM of claim 1, wherein the DLL circuit comprises a multi-phase clock partition.

4. The eDRAM of claim 1, wherein the predetermined delay is proportional to a cycle time of the clock signal.

5. The eDRAM of claim 1, wherein the plurality of control signals comprises word-line enable, sense amplifier enable, column select and word-line off signals.

6. The eDRAM of claim 1, wherein the plurality of steps comprises a selected word-line being turned on, a plurality of sense amplifiers being activated, a plurality of selected columns being activated and the selected word-line being turned off.

7. The eDRAM of claim 1, wherein the clock signal is a system signal external to the eDRAM.

8. An embedded dynamic random access memory (eDRAM) comprising:
   a clock signal;
   at least one delay-locked loop (DLL) circuit coupled to the clock signal and configured in a multi-phase partition of the clock signal to generate a plurality of control signals each having a predetermined delay from the clock signal;
   a receive activate circuit coupled between the clock signal and the DLL circuit for controlling activations of the DLL circuit when needed by a system; and
   at least one DRAM array coupled to the plurality of control signals,
   wherein the DRAM array operates in a plurality of steps controlled by the plurality of control signals.

9. The eDRAM of claim 8, wherein the DLL circuit comprises a feedback loop.

10. The eDRAM of claim 8, wherein the predetermined delay is proportional to a cycle time of the clock signal.

11. The eDRAM of claim 8, wherein the plurality of control signals comprises word-line enable, sense amplifier enable, column select and word-line off signals.

12. The eDRAM of claim 8, wherein the plurality of steps comprises a selected word-line being turned on, a plurality of sense amplifiers being activated, a plurality of selected columns being activated and the selected word-line being turned off.

13. An embedded dynamic random access memory (eDRAM) comprising:
   a clock signal;
   at least one delay-locked loop (DLL) circuit coupled to the clock signal and configured to generate a plurality of control signals each having a predetermined delay from and proportional to a cycle time of the clock signal;

a receive activate circuit coupled between the clock signal and the DLL circuit for controlling activations of the DLL circuit when needed by a system; and at least one DRAM array coupled to the plurality of control signals, wherein the DRAM array operates in a plurality of steps controlled by the plurality of control signals.

14. The eDRAM of claim 13, wherein the DLL circuit comprises a feedback loop.

15. The eDRAM of claim 13, wherein the DLL circuit comprises a multi-phase clock partition.

16. The eDRAM of claim 13, wherein the plurality of control signals comprises word-line enable, sense amplifier enable, column select and word-line off signals.

17. The eDRAM of claim 13, wherein the plurality of steps comprises a selected word-line being turned on, a plurality of sense amplifiers being activated, a plurality of selected columns being activated and the selected word-line being turned off.

* * * * *